(12) United States Patent
Hirayama et al.

(10) Patent No.: US 7,811,847 B2
(45) Date of Patent: Oct. 12, 2010

(54) OPTICAL SEMICONDUCTOR DEVICE AND METHOD FOR MANUFACTURING THE SAME

(75) Inventors: Hideki Hirayama, Saitama (JP); Tomoaki Ohashi, Saitama (JP); Norihiko Kamata, Saitama (JP)

(73) Assignee: Riken (JP)

( * ) Notice: Subject to any disclaimer, the term of this patent is extended or adjusted under 35 U.S.C. 154(b) by 137 days.

(21) Appl. No.: 12/055,949

(22) Filed: Mar. 26, 2008

(65) Prior Publication Data
US 2009/0057646 A1    Mar. 5, 2009

(30) Foreign Application Priority Data
Aug. 27, 2007   (JP) ............................. 2007-219890

(51) Int. Cl.
*H01L 21/00* (2006.01)
(52) U.S. Cl. ................................. 438/46; 257/E21.113
(58) Field of Classification Search ................. 438/604; 257/E21.113
See application file for complete search history.

(56) References Cited

U.S. PATENT DOCUMENTS

| | | | |
|---|---|---|---|
| 5,834,331 | A | 11/1998 | Razeghi |
| 6,865,005 | B2 | 3/2005 | Aoki et al. |
| 7,141,961 | B2 | 11/2006 | Hirayama et al. |
| 7,244,385 | B2 | 7/2007 | Aoki et al. |
| 7,294,867 | B2 | 11/2007 | Akita et al. |
| 7,309,394 | B2 | 12/2007 | Hirayama et al. |
| 2006/0160345 | A1* | 7/2006 | Liu et al. ..................... 438/604 |
| 2006/0286782 | A1* | 12/2006 | Gaska et al. ................. 438/483 |

FOREIGN PATENT DOCUMENTS

| JP | 9-64477 A | 3/1997 |
|---|---|---|
| JP | 11111617 | 4/1999 |
| JP | 2004-228489 | 8/2004 |
| JP | 2008078613 | 4/2008 |

OTHER PUBLICATIONS

Toru Yatabe et al.; Rapid high-efficiency deep ultraviolet emission from AlGaN quantum well by high-quality AlN buffer; Extended Abstracts (The 54th Spring Meeting, 2007); The Japan Society of Applied Physics and Related Societies No. 1; Mar. 27, 2007; p. 372.

(Continued)

*Primary Examiner*—Chandra Chaudhari
(74) *Attorney, Agent, or Firm*—Lando & Anastasi, LLP

(57) ABSTRACT

Because of a large lattice mismatch between a sapphire substrate and a group III-V compound semiconductor, a good crystal is difficult to grow. A high-quality AlN buffer growth structure A on a sapphire substrate includes a sapphire (0001) substrate 1, an AlN nucleation layer 3 formed on the sapphire substrate 1, a pulsed supplied AlN layer 5 formed on the AlN nucleation layer 3, and a continuous growth AlN layer 7 formed on the pulsed supplied AlN layer 5. Formed on the continuous growth AlN layer 7 is at least one set of a pulsed supplied AlN layer 11 and a continuous growth AlN layer 15. The AlN layer 3 is grown in an initial nucleation mode which is a first growth mode by using an $NH_3$ pulsed supply method. The pulsed supplied AlN layer 5 is formed by using $NH_3$ pulsed supply in a low growth mode which is a second growth mode that increases a grain size and reduces dislocations and therefore is capable of reducing dislocations and burying the nucleation layer 3. The continuous growth AlN layer 7 is a fast vertical growth mode that improves flatness and suppresses crack occurrences. As examples of the thickness of layers; the pulsed supplied AlN layer 5, 11 is 0.3 μm and the thickness of the continuous growth AlN layer 7, 15 is 1 μm, for example. Characteristics of conditions under which layers are grown are as follows. The AlN layer 3 is grown under a high temperature and a high pressure with a low V-III ratio (less N). The pulsed supplied AlN layer 5 is grown at a low temperature and a low pressure with a high V-III ratio (more N). The continuous AlN layer 7 is grown at a high temperature and a high pressure with a high V-III ratio (Al rich and less N) without using an $NH_3$ pulsed supply AlN growth method.

14 Claims, 16 Drawing Sheets

OTHER PUBLICATIONS

Tomoaki Ohashi et al.; Realization of high-quality AlN buffer layer by alternative NH3 gas supply for the application to deep-UV LEDs; Extended Abstracts (The 54th Spring Meeting, 2007); The Japan Society of Applied Physics and Related Societies No. 1; Mar. 27, 2007; p. 372.

Tomoaki Ohashi et al.; 250 nm single-peaked deep-UV LED fabricated on high quality Ain buffer layer; Extended Abstracts (The 54th Spring Meeting, 2007); The Japan Society of Applied Physics and Related Societies No. 1; Mar. 27, 2007; p. 419.

Hideki Hirayama et al.; Realization of high internal quantum efficiency AlGaN quantum well for 250-280 nm deep UV-LEDs; Extended Abstracts (The 54th Spring Meeting, 2007); The Japan Society of Applied Physics and Related Societies No. 1; Mar. 27, 2007; p. 419.

Hideki Hirayama et al.; Development of 250-350 nm AlGaN-based ultraviolet high-intensity LEDs; O Plus E, Jun. 2007, vol. 29, No. 6, Serial Issue No. 331; pp. 572-581.

Hideki Hirayama et al.; 231-261 nm AlGaN deep-ultraviolet light-emitting diodes fabricated on AlN multilayer buffers grown by ammonia pulse-flow method on sapphire; American Institute of Physics, Applied Physics Letters 91, 071901 (2007), pp. 1-3.

Hideki Hirayama, et al.; Development of Deep-UV and Terahertz Semiconductor Emitting Devices and their Applications; The 13th International Micromachine/Nanotech Symposium; Jul. 26, 2007; pp. 55-70.

Hideki Hirayama, et al.; High-quality AlN Buffer Fabricated on Sapphire by Ammonia Pulse-flow Multi-layer Growth Method for application to deep UV-LEDs; Extended Abstracts of the 26th Electronic Materials Symposium EMS-26; Jul. 4, 2007; pp. 71-72.

Tohru Yatabe et al.; Remarkable Enhancement of 254-280 nm Deep UV Emission from AlGaN Quantum Wells by using High-quality AlN Buffer on Sapphire; Extended Abstracts of The 26th Electronic Materials Symposium EMS-26; Jul. 4, 2007; pp. 193-194.

Hideki Hirayama, et al.; 245-250 nm AlGaN-based deep ultraviolet light-emitting diodes fabricated on high-quality AlN buffer on sapphire; Extended Abstracts of the 26th Electronic Materials Symposium EMS-26; Jul. 4, 2007; pp. 321-322.

Hideki Hirayama, et al.; High-Efficiency UV LEDs using Quaternary InAlGaN; IEEJ Trans. EIS, vol. 125, No. 2, 2005; pp. 225-232.

Hideki Hirayama, et al.; Growth of (In)AlGaN Compound Semiconductors and their Application to 300-nm-Band High-Intensity UV-LEDs; The Review of Laser Engineering, vol. 30, No. 6, Jun. 2002, pp. 308-314.

Hideki Hirayama, et al.; Short Wavelength and High-Efficiency Operation of Deep UV LED Using Quaternary InAlGaN; The Review of Laser Engineering, vol. 32, No. 6, Jun. 2004, pp. 402-409.

N. Noguchi et al.; Control of polarity and improvement of quality of AlN/AlGaN template on sapphire by using TMAl pulse supply; Extended Abstracts (The 54th Spring Meeting, 2007); The Japan Society of Applied Physics and Related Societies No. 1; Mar. 27, 2007; p. 371.

Norimichi Noguchi et al.; Control of polarity and reduction of threading dislocation density (TDD) of AlN/AlGaN template by using TMAl pulse supply growth; Extended Abstracts of The 26th Electronic Materials Symposium; Jul. 4-6, 2007; pp. 189-190.

Zhang, J.P., et al.; "High-Quality AlGaN Layers over Pulsed Atomic-Layer Epitaxially Grown AlN Templates for Deep Ultraviolet Light-Emitting Diodes", Journal of Electronic Materials, vol. 32, pp. 364-370, Nov. 5, 2003.

Hirayama, Hideki et al.; Growth and Optical Properties of III-nitride Semiconductors for Deep UV (230-350 nm) Light-Emitting Diodes (LEDs) and Laser Diodes (LDs), RIKEN Review, No. 33, Focused on Coherent Science, pp. 28-32, Mar. 2001.

Yoshikawa, A., et al., "A New "Three-Step Method" for High Quality MOVPE Growth of III-Nitrides on Sapphire," Phys. Stat. Sol. (a) 188, No. 2, pp. 625-628, Jul. 12, 2001.

* cited by examiner

FIG. 1B

Maintain group III (Al) polarity → Grow with group-III-rich supply
(Using ammonia pulse flow)

(A) High-quality AlN nucleation
(pulsed supply growth)

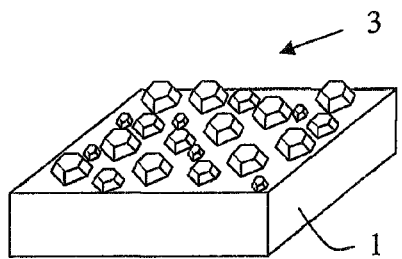

(B) Burial of nuclei by pulsed supply
enhanced lateral growth
(Reduction of threading dislocations)

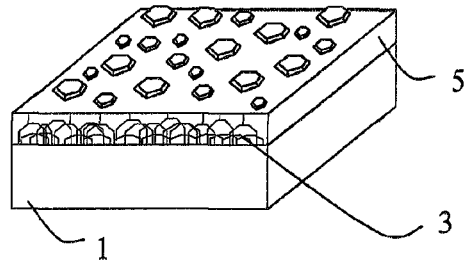

FIG. 1C

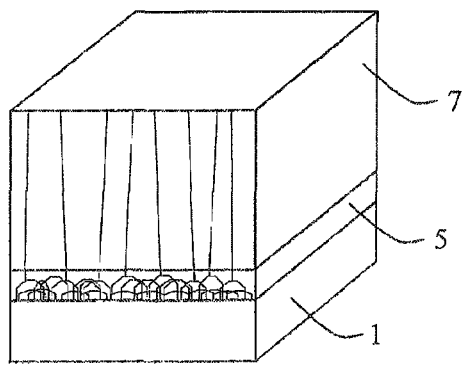

(C) Planarization and crack
prevention by continuous supply
fast vertical growth

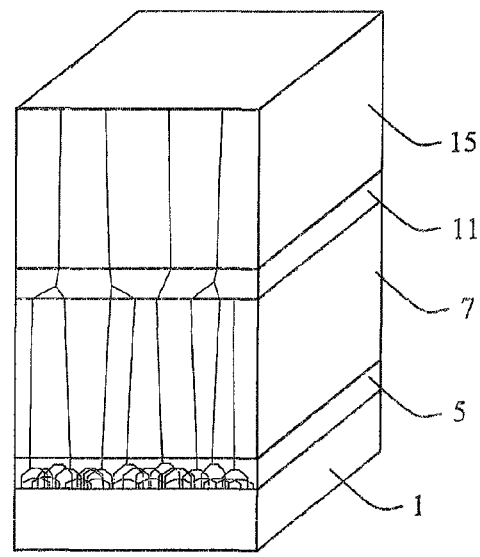

(D) Repetition of pulsed supply enhanced lateral
growth and continuous fast vertical growth
(Reduction of threading dislocation density,
prevention of cracks, and planarization)

|  | AlN (1) | AlN (2) | AlN (3) |
|---|---|---|---|
| Growth temperature | 1300°C | 1200°C | 1200°C |
| Growth pressure | 200Torr | 76Torr | 76Torr |
| Growth rate |  | Approximately 0.6 μm/h | Approximately 6 μ/h |
| Al flow rate | 12sccm | 15sccm | 50sccm |
| NH$_3$ flow rate | 30sccm | 500sccm | 100sccm |
| Growth cycle | 20 times | 200times |  |
| Growth time |  |  | 15min |

|  | Buffer | Well layer | Barrier |
|---|---|---|---|
| TMA | 50sccm | 15~25sccm | 50sccm |
| TMG | 4~5sccm | 5sccm | 4~5sccm |
| $NH_3$ | 2slm | 2slm | 2slm |
| Growth time |  | 4~10s | 10~30s |

OPTICAL SEMICONDUCTOR DEVICE AND METHOD FOR MANUFACTURING THE SAME

BACKGROUND OF THE INVENTION

1. Field of the Invention

The present invention relates to an optical semiconductor device and a method for manufacturing the same and, in particular, to a deep ultraviolet light emitting device technology using a group III-V compound semiconductor.

2. Background Art

Nitride semiconductor materials containing nitrogen as a group V element are in the spotlight in the field of semiconductor light emitting devices such as light emitting diodes and laser diodes that use a pn junction, and are being researched and developed. Nitride semiconductors such as AlN, GaN, and InN are direct transition semiconductors and ternary and quaternary mixed crystals have the characteristic of being able to emit light in the range from infrared to deep ultraviolet by setting compositions as appropriate to change band-gaps.

Attention is being paid to semiconductor light emitting devices that use an AlGaInN quaternary mixed crystal as a material of a light emitting layer to emit light in an ultraviolet range (see JP Patent Publication (Kokai) No. 9-64477A (1997), for example). It is reported that a light emitting peak wavelength of an AlGaInN layer can be set in a wavelength region less than or equal to 360 nm and its internal quantum efficiency can be improved to a level comparable to an InGaN layer, although the AlGaInN layer contains indium.

However, it is difficult or, if possible, expensive, to produce a high-quality and large-area substrate for epitaxial growth made of a nitride semiconductor. Therefore, a sapphire substrate, for example, needs to be used as a substrate for epitaxial growth in manufacturing a semiconductor light emitting device that uses a nitride semiconductor. FIG. 17 shows the relationship between the lattice constant and band-gap energy (corresponding to wavelength) of an InAlGaAs-based quaternary mixed crystal. Also shown is the wavelength of an ultraviolet gas laser. As shown in FIG. 17, in order to produce a solid-state light emitting device in a short-wavelength region, the Al composition of AlGaN needs to be increased to increase the band-gap energy. Accordingly, the difference in lattice constant from the sapphire substrate (0.473 nm) increases. The increase in the mismatch between lattice constants poses a problem that the threading dislocation density in a nitride semiconductor film increases. Threading dislocations reduce the internal quantum efficiency of the semiconductor light emitting device. Therefore, it is necessary to address the problem of the dislocation to improve the internal quantum efficiency of semiconductor light emitting devices.

An object of the present invention is to increase the emission intensity of deep ultraviolet light by using an AlGaInN-based material, in particular, an AlGaN-based material, as the material of a light emitting layer.

SUMMARY OF THE INVENTION

In order to grow an AlGaInN-based material, in particular, an AlGaN-based material, on a sapphire substrate to produce a deep ultraviolet light emitting device and a crystal structure suitable for the device, the quality of an AlN buffer layer that is grown on the sapphire substrate to serve as a buffer layer between the sapphire substrate and the light emitting structure must be enhanced. Therefore, to solve the following issues, their respective means are used.

(1) To reduce threading dislocations: Initial nucleation and burial of nuclei.

(2) To make the layer free of cracks and planarize the surface: Multi-step growth burial using two growth modes, N source pulsed supply growth and continuous growth.

(3) To stabilize group III polarity: Al-rich supply growth (N source pulsed supply).

According to one aspect of the present invention, there is provided a semiconductor structure comprising a group III-V layer formed on a substrate, the group III-V layer including: a nucleation layer formed on the substrate; a group V source pulsed supplied layer formed on the nucleation layer by pulsed supply that supplies a group V source in a time-pulsed manner while supplying a group III source; and a continuous supplied layer formed on the V source pulsed supplied layer by continuously supplying a group III source and a group V source; wherein the group III-V layer forms a buffer layer capable of emitting light in a ultraviolet wavelength region and suitable for a light emitting device structure.

The nucleation layer is an initial stage for forming a high-quality group III-V compound. The group V source is supplied in a time-pulsed manner (in other words, group V supply periods are provided) to suppress gas phase reaction of group III, facilitate migration of groups III and V, and extend the grain size to reduce dislocations. By providing an Al-rich condition, the polarity of the surface can be made group-III polarity, thereby forming a stable surface. Furthermore, because the group III and group V sources are continuously supplied, fast vertical growth can be achieved and therefore cracks which would otherwise be caused by pulsed supply can be prevented.

The ultraviolet wavelength region may be for example the region from 230 nm to 350 nm, preferably the deep ultraviolet wavelength region from 230 nm to 280 nm, and the optical semiconductor device is implemented by both a material having a band-gap that emits light in a wavelength region corresponding to that region and a group III-V material that approximately lattice-matches to the material.

There is also provided a semiconductor structure comprising a group III nitride layer formed on a sapphire substrate, the group III nitride layer including: a nucleation layer formed on the sapphire substrate; a nitrogen source pulsed supplied layer formed on the nucleation layer by pulsed supply that supplies a nitrogen source in a time-pulsed manner while supplying a group III source; and a continuous supplied layer formed on the nitrogen source pulsed supplied layer by continuously supplying a group III source and a nitrogen source; wherein the group III nitride layer forms a buffer layer capable of emitting light in an ultraviolet wavelength region and suitable for a light emitting device structure.

The lattice constant of the sapphire substrate is 0.4763 nm, which differs from that of AlN, 0.3114 nm, and that of the a-axis of GaN, 0.3189 nm. Accordingly, threading dislocations and edge dislocations due to the lattice mismatch tend to occur. Therefore, the buffer layer between the sapphire substrate and the group III nitride layer is crucial.

The nucleation layer is formed preferably by pulsed supply. The group III-V layer, the group III nitride layer, and the AlN layer can be used as a buffer layer. Preferably, multiple sets of the pulsed supplied layer and the continuous supplied layer are provided.

The present invention may be a semiconductor device including the semiconductor structure described above and an InAlGaN-based semiconductor layer formed in the buffer layer. The semiconductor layer includes a quantum well structure. The quantum well structure is formed by a group III-V crystal layer. The group III-V crystal layer is made of an InAlGaN-based semiconductor crystal. The semiconductor layer includes an InAlGaN-based pn junction.

The device is preferably an optical semiconductor device that emits light in the range from 230 nm to 350 nm.

According to another aspect of the present invention, there is provided a semiconductor structure producing method including the steps of: preparing a substrate; and forming a group III-V crystal layer on the substrate, the step of forming the group III-V crystal layer including the step of forming a nucleation layer on the substrate, the step of forming a group V source pulsed supplied layer on the nucleation layer by pulsed supply that supplies a group V source in a time-pulsed manner while supplies a group III source, and the step of forming a continuous supplied layer on the group V source pulsed supplied layer by continuously supplying a group III source and a group V source, wherein the step of forming the group III-V crystal layer forms a buffer layer capable of emitting light in an ultraviolet wavelength region and suitable for a light emitting device structure.

There is also provided a semiconductor structure producing method including the steps of: preparing a sapphire substrate; and forming a group III nitride layer on the substrate, the step of forming the group III nitride layer including the step of forming a nucleation layer on the sapphire substrate, the step of forming a nitrogen source pulsed supplied layer on the nucleation layer by pulsed supply that supplies a nitrogen source in a time-pulsed manner while supplying a group III source, and the step of forming a continuous supplied layer on the nitrogen source pulsed supplied layer by continuously supplying a group III source and a nitrogen source.

There is also provided a semiconductor structure producing method including the steps of: preparing a sapphire substrate; and forming an AlN layer on the sapphire substrate, the step of forming the AlN layer including the step of forming a nucleation layer on the sapphire substrate, the step of forming a nitrogen source pulsed supplied layer on the nucleation layer by pulsed supply that supplies a nitrogen source in a time-pulsed manner while supplying an aluminum source, and the step of forming a continuous supplied layer on the nitrogen source pulsed supplied layer by continuously supplying an aluminum source and a nitrogen source. The step of forming the nucleation layer preferably forms the nucleation layer by pulsed supply. The step of forming the layer by pulsed supply preferably includes the step of supplying an N source intermittently. In doing this, preferably an Al source is continuously supplied. The step may include the step of providing multiple sets of the pulsed supplied layer and the continuous supplied layer.

There is also provided a semiconductor structure semiconductor structure producing method including the steps of: preparing a substrate; and forming a group III-V crystal layer on the substrate, the step of forming the III-V crystal layer including the step of forming a group V source pulse supplied layer on the substrate by pulsed supply that supplies group V source in a time-pulsed manner while supplying a group III source; the step of forming a continuous supplied layer on the group V source pulsed supplied layer by continuously supplying a group III source and a group V source, wherein the step of forming the group III-V crystal layer forms a buffer layer capable of emitting light in an ultraviolet wavelength region and suitable for a light emitting device structure.

According to the present invention, a high-quality buffer layer can be formed on a sapphire substrate, which can implement a group III nitride light emitting structure capable of emitting deep ultraviolet light. The high-quality buffer layer is advantageous in that the high-quality buffer layer can significantly improve the luminous efficiency of the group III nitride light emission structure formed on the high-quality buffer layer.

BRIEF DESCRIPTION OF THE DRAWINGS

FIG. 1B is a diagram of a specific manufacturing process also showing how threading dislocations are reduced.

FIG. 1C is a diagram continued from FIG. 1B.

DETAILED DESCRIPTION OF THE PREFERRED EMBODIMENTS

Figure 1A:
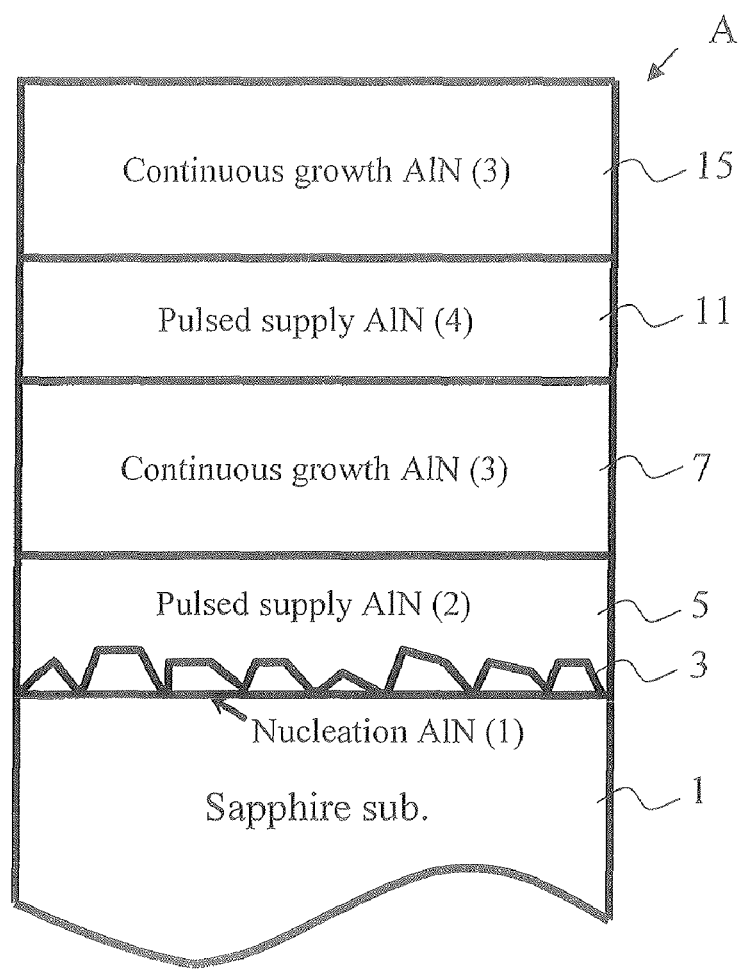
FIG. 1A shows an exemplary AlN high-quality buffer growth structure on a sapphire substrate according to an embodiment of the present invention.
Figures 2, 3:
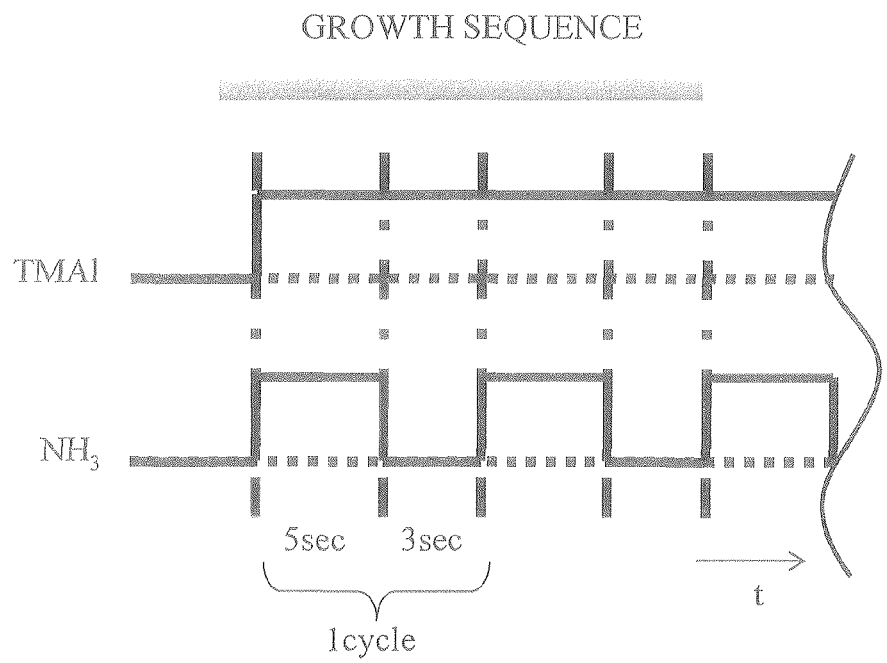
FIG. 2 shows exemplary conditions under which an AlN high-quality buffer layer is grown.
FIG. 3 is an example of a sequence diagram for AlN growth by $NH_3$ pulsed supply, which is one of key points of the embodiment.

A principle of an N source pulsed supply multi-step growth technique according to an embodiment of the present invention will be described below. FIG. 1A shows an exemplary AlN high-quality buffer growth structure on a sapphire substrate according to the embodiment. FIG. 2 shows exemplary conditions under which an AlN high-quality buffer layer is grown. FIG. 3 is an example of a sequence diagram for AlN growth by $NH_3$ pulsed supply, which is one of the key points of the embodiment. FIGS. 1B and 1C are diagrams of a specific manufacturing process also showing how threading dislocations are reduced.

As shown in FIG. 1A, an AlN high-quality buffer growth structure A on sapphire according to the embodiment includes a sapphire (0001) substrate 1, an AlN nucleation layer 3 formed on the sapphire substrate 1, a pulsed supplied AlN layer 5 formed on the AlN nucleation layer 3, and a continuous growth AlN layer 7 formed on the pulsed supplied AlN layer 5. Formed on the continuous growth AlN layer 7 is at least one set of a pulsed supplied AlN layer 11 and a continuous growth AlN layer 15. The AlN layer 3 is grown in an initial nucleation mode, which is a first growth mode, by using an $NH_3$ pulsed supply method which will be described later. The pulsed supplied AlN layer 5 is formed by using $NH_3$ pulsed supply in a slow growth mode, which is a second mode that increases grain size and reduces dislocations. The pulsed supplied AlN layer 5 can reduce dislocations and flatly bury the uneven, nucleation layer 3. The continuous growth AlN layer 7 is a fast vertical growth mode that further improves the flatness and suppresses cracks. The thickness of each of the pulsed supplied AlN layers 5, 11 in FIG. 1A is 0.3 μm and the thickness of each of the continuous growth AlN layers 7, 15 is 1 μm, for example.

The conditions under which their respective layers are grown are (1), (2), (3), (4), and (3), in this order starting from the substrate 1 side, and the growth conditions (4) are the same as the conditions (2) in the example shown in FIG. 1A. In practice, however, the conditions (4) often differ from the conditions (2). That is, the conditions under which nuclei are buried can differ from the conditions for pulsed supply in the flat portion.

As shown in FIGS. 1B and 1C, first (A) high-quality AlN nuclei are formed (pulsed supply growth), (B) the nuclei are buried by pulsed supply enhanced lateral growth (reduction of threading dislocations), then (C) continuous supply fast vertical growth is performed to planarize the surface and prevent cracks, and (D) pulsed supply enhanced lateral growth and continuous fast vertical growth are repeated (reduction of threading dislocation density, prevention of cracks, and planarization).

FIG. 2 shows conditions under which the layers are grown. Characteristics of conditions under which the layers are grown are as follows: (1) The AlN layer 3 is grown at a high temperature and a high pressure with a low V-III ratio (less N). (2) The pulsed supplied AlN layer 5 is grown at a low temperature and a low pressure with a high V-III ratio (more N). (3) The continuous growth AlN layer 7 is grown at a high temperature and a high pressure with a high V-III ratio (Al-rich and less N), without using the $NH_3$ pulsed supply AlN growth method.

As shown in the sequence diagram of FIG. 3, the $NH_3$ pulsed supply AlN growth method repeats a cycle in which, while TMA 1, which is an Al source, is being continuously supplied, $NH_3$, which is an N source, is supplied for 5 seconds and then the supply of $NH_3$ is suspended for 3 seconds. The suspension of supply of $NH_3$ can minimize gas phase reaction between N and Al. Another advantage is that the Al-rich growth conditions provide a group III polar surface and therefore a stable surface.

The sequence diagram shown in FIG. 3, which is illustrative only, characterized in that periods are provided during which only the Al source is supplied. Various other sequences such as change of supply periods are possible. For example, the term continuous growth does not necessary refers to a completely continuous growth in terms of time; the requirement is that Al is supplied to the extent that is regarded as practically continuous. Furthermore, pulsed supply can be implemented by clearly varying the supply, rather than completely turning on and off the supply.

Figure 4A:
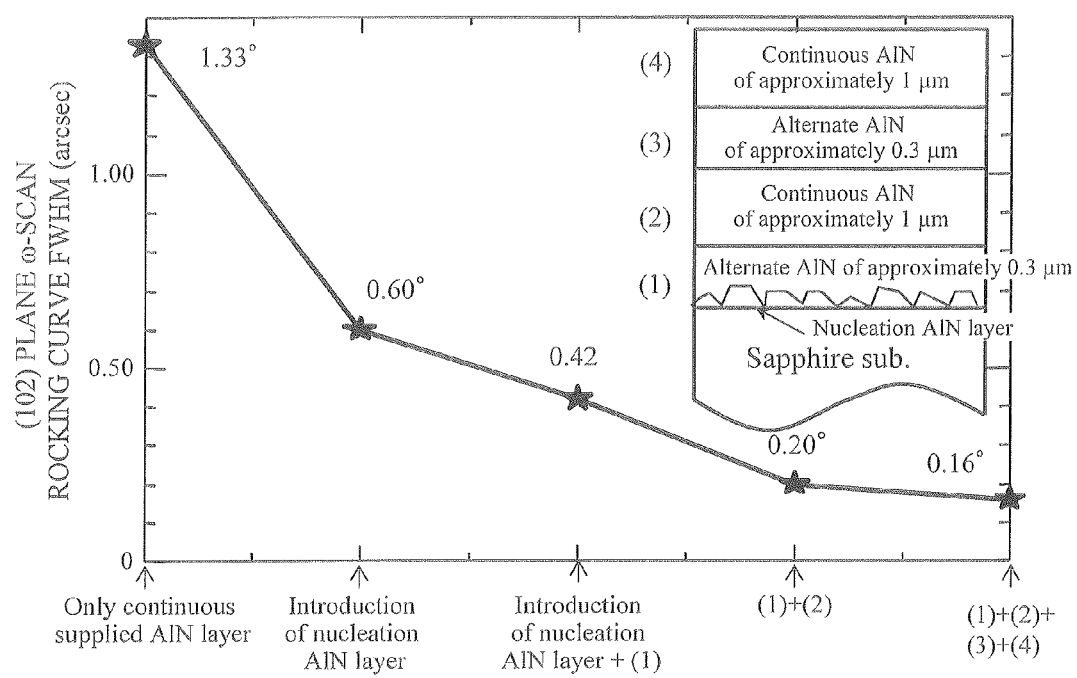
FIG. 4A shows an evaluation example of a buffer structure according to the embodiment, showing measured values of the half width of a scan rocking curve on an XRD (102) plane at each growth point, indicating the magnitude of edge dislocations.

FIG. 4 shows an evaluation example of the structure described above, shows measured values of the half width of a scan rocking curve on an XRD (102) plane at each growth point, and indicates characteristics relating to the magnitudes of edge dislocations. As shown in FIG. 4, when only the continuous supplied AlN layer is provided, the half width is 1.33 degrees and the RMS grain size is as large as 21.4 nm. When the AlN nucleation layer 3 is introduced, the half width is 0.60 degrees. When the pulsed supplied AlN layer 5 (AlN1) is introduced, the half width is 0.42 degrees. In the case of (1)+(2), the half width becomes 0.20 degrees. In the case of (1)+(2)+(3)+(4), the half width is 0.16 degrees and the RMS grain size is as small as approximately 0.163 nm, which indicates a high flatness. Also, little cracks have been found. FIG. 5 shows exemplary XRD spectra. It can be seen from FIG. 5 that a good peak with a small half width can be obtained when using a three-layer AlN structure and a higher intensity and smaller half width can be obtained when using a five-layer structure.

This shows that the growth technique described above can suppress edge dislocations, improve the flatness, and form a crack-free AlN layer.

Figure 4B:
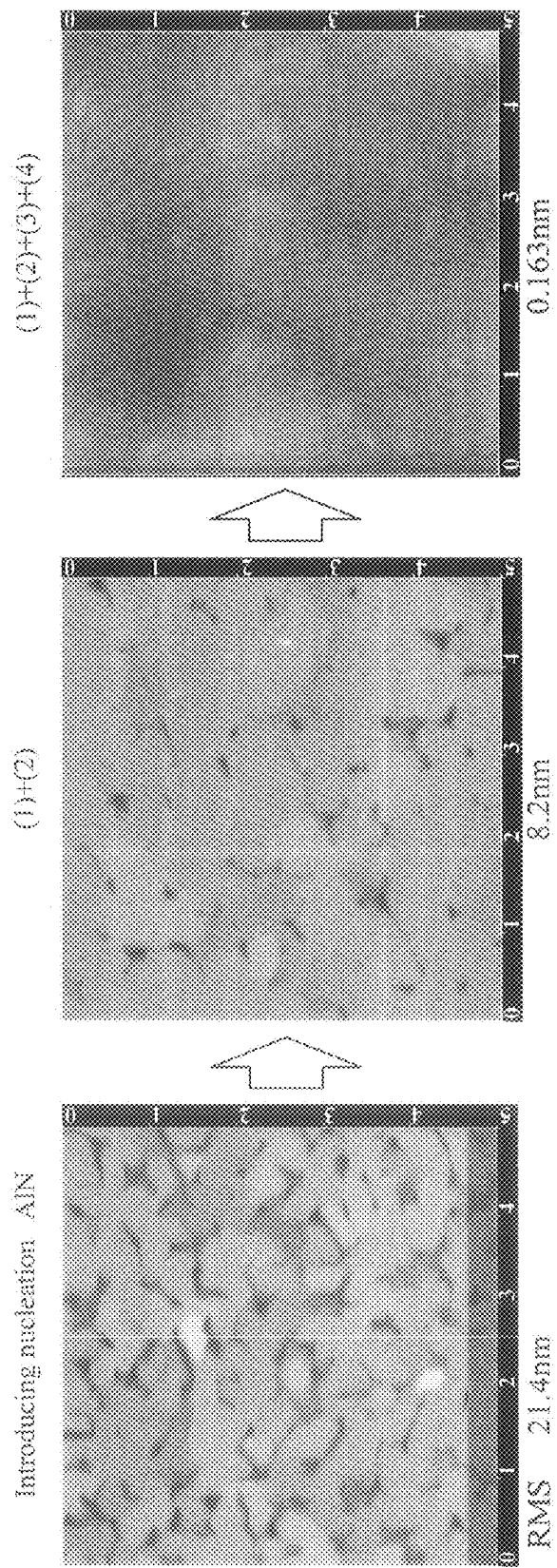
FIG. 4B shows evaluation of surface flatness under an atomic force microscope (AFM).
Figure 5:
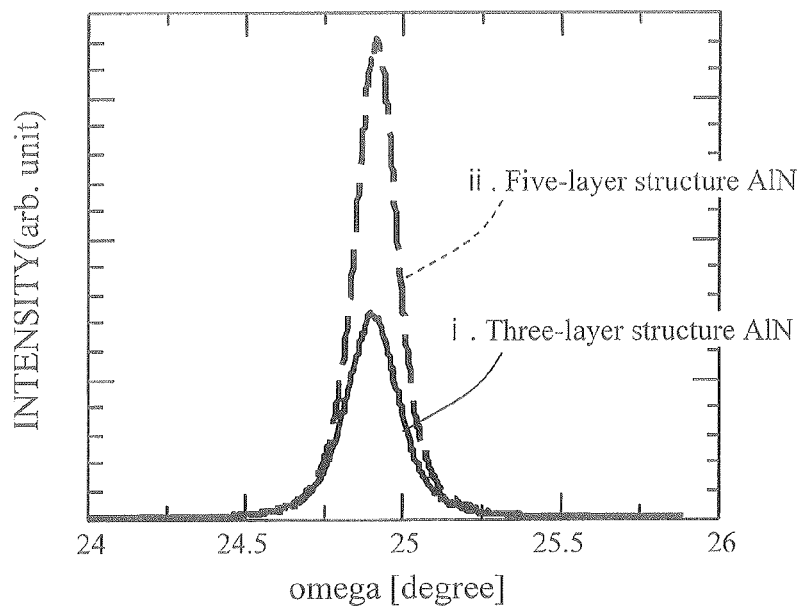
FIG. 5 shows exemplary spectra on an XRD.

FIG. 4B shows evaluation of surface flatness by using an atomic force microscope (AFM). As shown in FIG. 4B, when the AlN nucleation layer 3 is introduced, the RMS is 21.4 nm, indicating a rough surface. With (1)+(2), the RMS is improved to 8.2 nm. With (1)+(2)+(3)+(4), an RMS as small as 0.163 nm is attained, indicating a significantly improved flatness.

Figure 6:
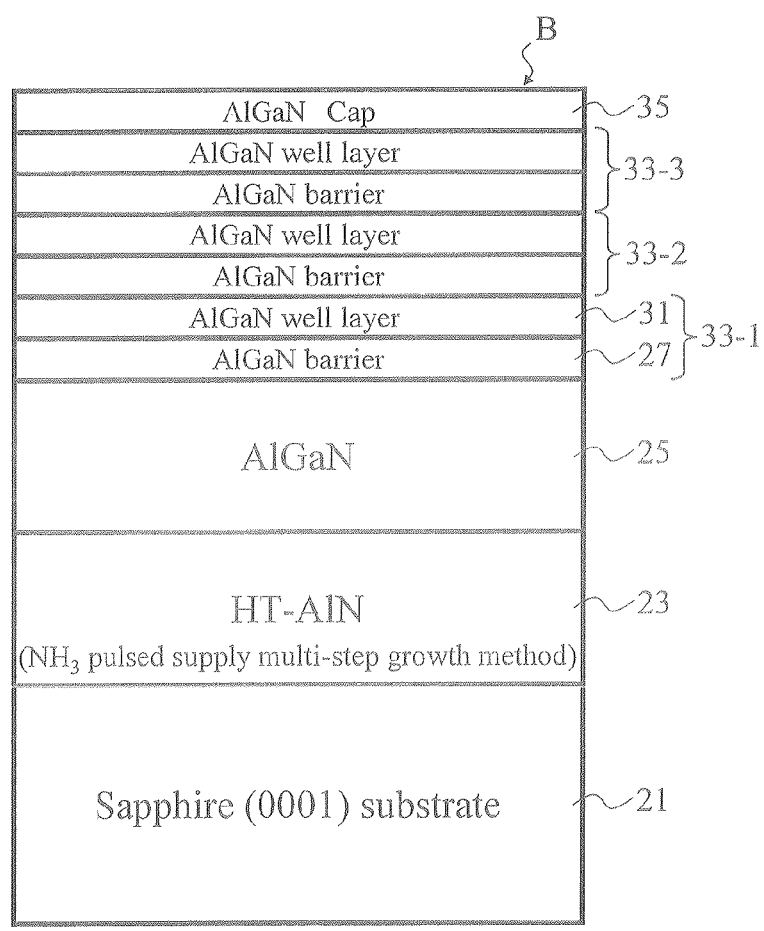
FIG. 6 is a schematic cross-sectional view showing an exemplary configuration of a quantum well structure.
Figures 7, 8:
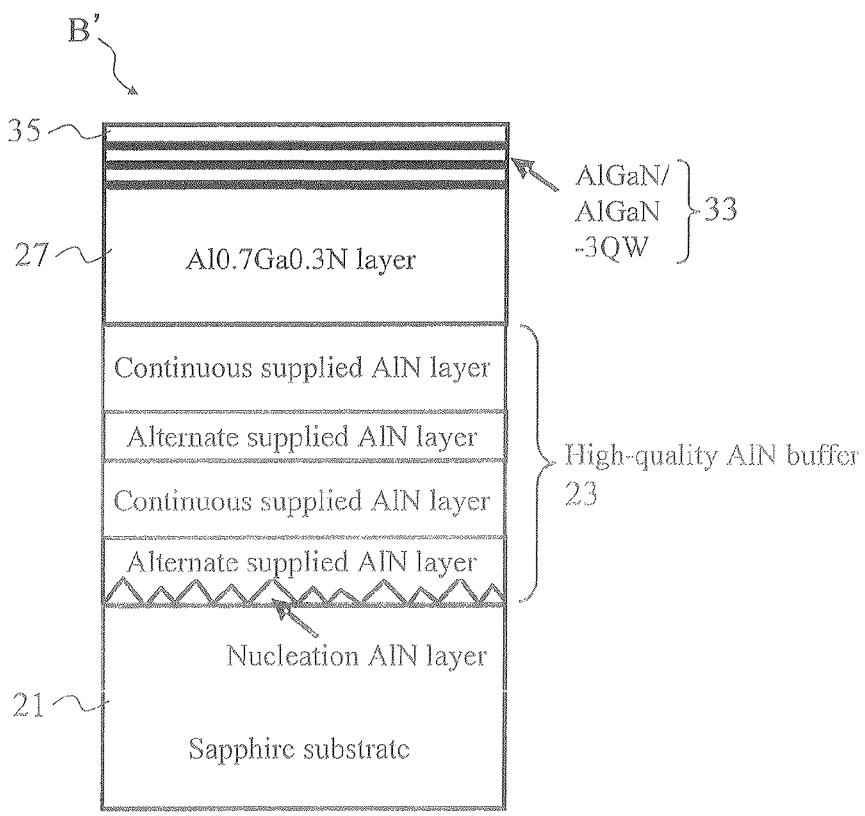
FIG. 7 shows exemplary conditions under which the quantum well structure shown in FIG. 6 is grown.
FIG. 8 shows in further details the structure of the high-quality AlN buffer layer of the structure shown in FIG. 6.

A quantum well structure manufactured by using the AlN buffer layer described above will be described below. FIG. 6 is a schematic cross-sectional view showing an exemplary configuration of the quantum well structure and FIG. 7 shows an exemplary condition under which the quantum well is grown. As shown in FIG. 6, the quantum well structure B includes a sapphire (0001) substrate 21, a HT-AlN layer 23 grown on the sapphire substrate 21 (by the $NH_3$ pulsed supply multi-step growth method described above), an AlGaN layer 25, three sets (33-1 to 33-3) of AlGaN barrier layer 27 and AlGaN well layer 31 (the barrier layer and well layer have different compositions of Al and Ga), and an AlGaN cap layer 35. The AlGaN layer was grown at a temperature of 1120 degrees Celsius under a pressure of 76 Torr by using a low pressure horizontal MOCVD system as a growth system. The flow rates and growth times of TMA, TMG, and $NH_3$ in the buffer, well, and barrier layers are as shown in FIG. 7. By changing the flow rates of TMA and TMG, the compositions of Al and Ga in the barrier and well layers are varied.

FIG. 8 shows the structure of the high-quality AlN buffer layer of the structure shown in FIG. 6 in further detail. Two sets of 0.3-μm-thick alternate supplied AlN layer and 1-μm-thick continuous supplied AlN layer are used and the thickness of the $Al_{0.7}Ga_{0.3}N$ step is 2 μm in this example.

The MOCVD system used can be implemented by referring to FIG. 2 and FIGS. 7 to 9 of JP Patent Publication (Kokai) No. 2004-228489A, for example, which is a patent document by the present inventors and therefore description of details of the MOCVD system will be omitted herein.

Figure 9:
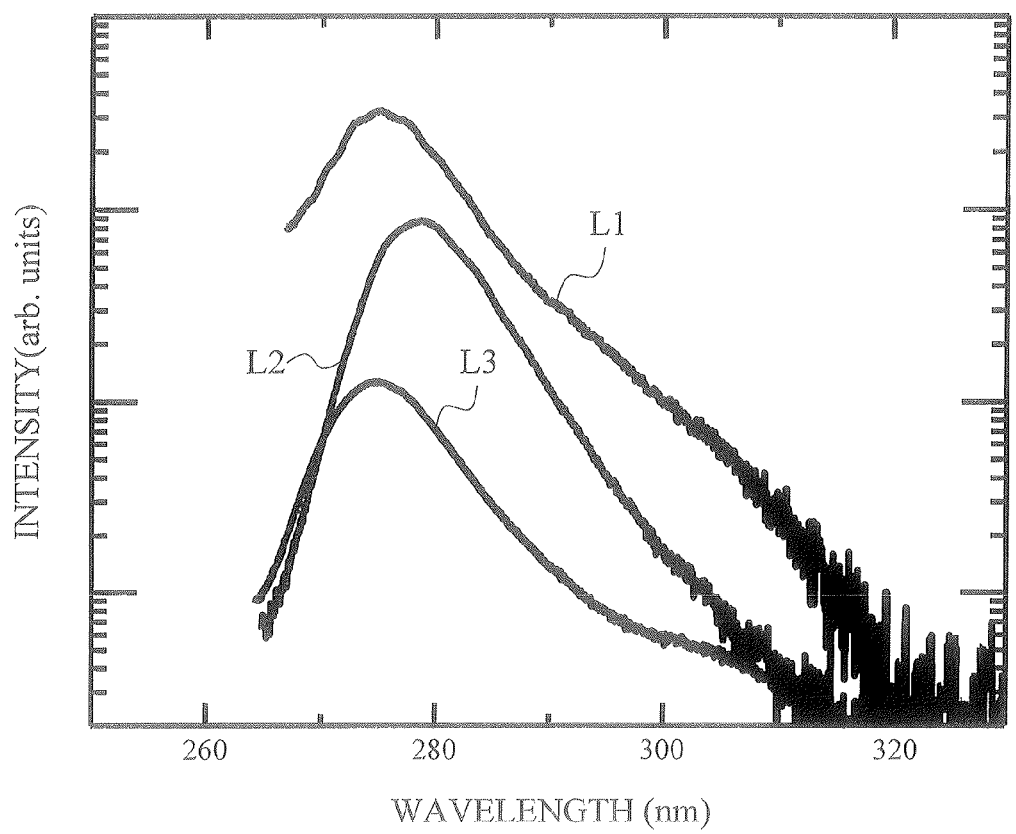
FIG. 9 is a diagram showing the dependence of PL light emission intensity on wavelength at room temperature.
Figure 10:
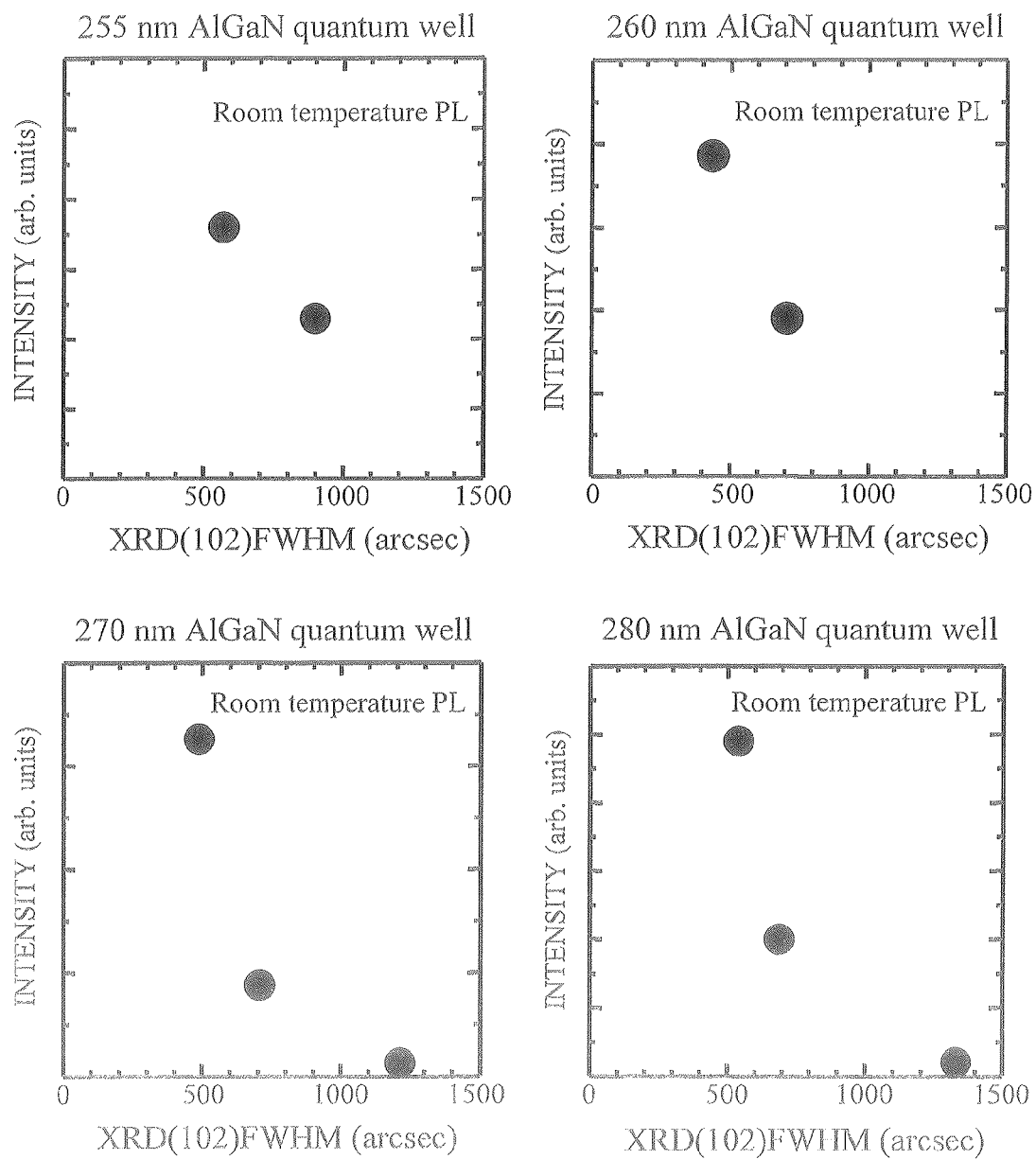
FIG. 10 is a diagram showing the dependence of PL intensity of AlGaN quantum wells in the range from 255 nm to 280 nm on the half width of XRD (102), that is, the dependence of the PL intensity on crystallinity.

FIG. 9 shows the dependence of PL emission intensity on wavelength at room temperature. L1 to L3 represent the results of measurements on the same structures. However, in the case of L1 and L2, the X-ray diffraction (102) plane ω-scan rocking curve half widths (corresponding to edge dislocation densities in threading dislocations. Approximately 90% of dislocations are edge dislocations and approximately 10% is screw dislocations in the case of growth by MOCVD.) are large because the V/III ratios (actually the ammonia flow rates) in the pulsed supplied layer and continuous supplied layer are deviated from the values shown in FIG. 2 and a sufficiently high quality is not attained under the deviated conditions.

FIG. 9 shows a comparison among light emission intensities of AlGaN/AlGaN quantum wells with the same structure and conditions, formed on three AlGaN buffers with their respective X-ray half widths of approximately 500, 700, and 300 arcsec on multi-step growth AlN. Such small differences in X-ray half width result in an intensity ratio of as much as 30. This shows that the effect of reduction of dislocations on the improvement of luminous efficiency is enormous.

As can be seen from FIG. 9, in the structure according to the present embodiment, the XRD (102) half width is reduced from 1214 to 488 arcsec and the PL intensity at room temperature is higher than conventional structures by a factor of as high as approximately 30.

FIGS. 10A to 10D show the half-width dependences of the PL intensities of AlGaN quantum wells in the range from 255 nm to 280 nm, that is, dependences on crystallinity. As can be seen from these figures, when the half-width dependence of XRD (102) decreases from 1000 arcsec to 500 arcsec, that is, the crystallinity dependence is improved, the PL intensity at room temperature dramatically increases at any of the emission wavelengths. Thus, it has been shown that the high-quality AlN buffer layer dramatically increases the PL emission intensity of the AlGaN quantum well formed on the buffer layer, that is, the high-quality AlN buffer layer increases the efficiency.

Figure 11:
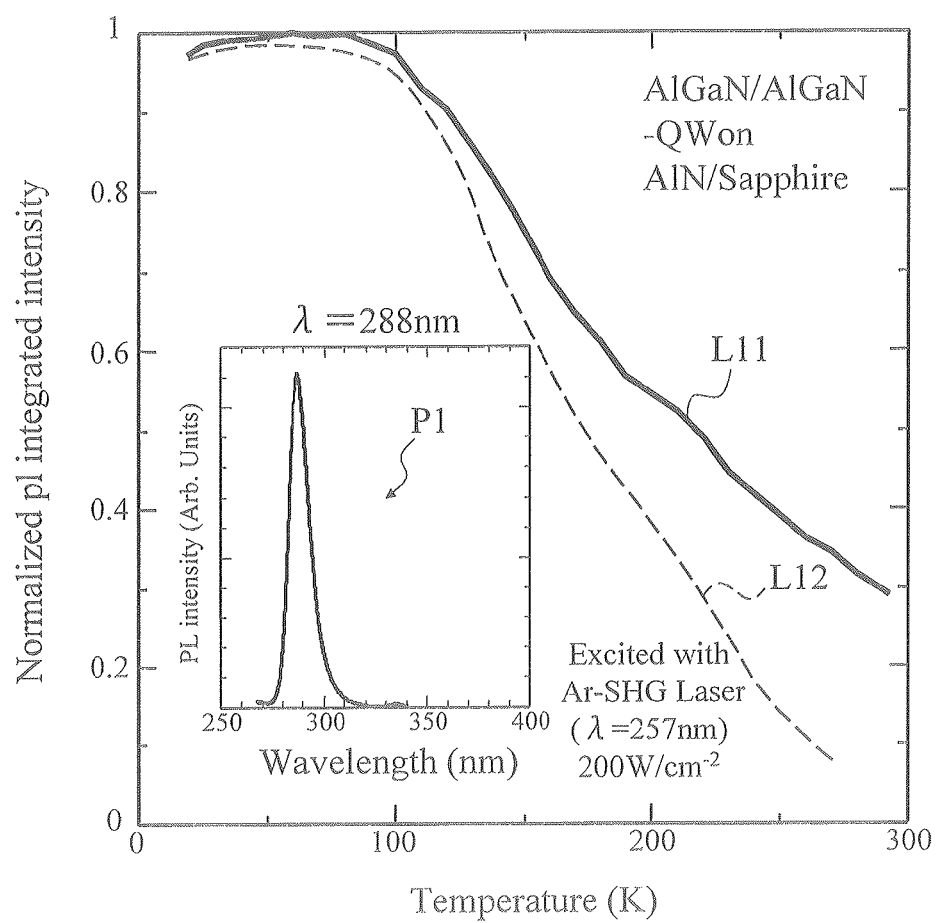
FIG. 11 is a diagram showing the temperature dependence of the PL intensity of the structure shown in FIG. 8.

Estimated internal quantum efficiency (IQE) of a highly-excited AlGaN quantum well will be described below. FIG. 11 shows the temperature dependence of the PL intensity of the structure in FIG. 8. The solid curve (L11) represents an estimation example of the present embodiment and dashed curve (L12) represents an estimation example of an exemplary conventional technique. As shown in FIG. 11, the quantum efficiency under a low temperature condition under which the influence of nonradiative recombination is small is approximately 1, which is approximately the same as that of the conventional technique. However, it is estimated that a value as high as approximately 30% is obtained around the room temperature (300 K) by the technique according to the present embodiment. This shows that a significant improvement over the conventional method is provided by the present embodiment. Inset P1 in FIG. 11 is a graph of the PL spectrum of a device that emits light at λ=288 nm. It can be seen from Inset P1 that a clear single peak has been obtained.

Figure 12:
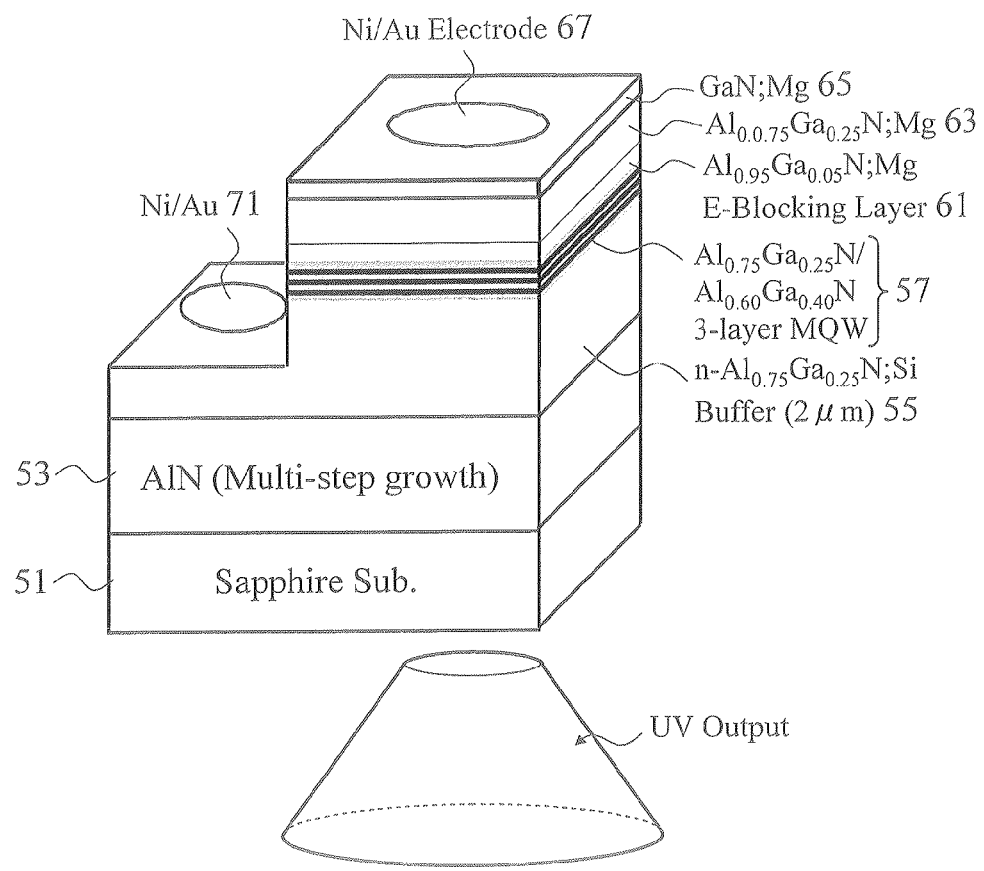
FIG. 12 shows an exemplary configuration of a 250-nm deep ultraviolet LED according to the embodiment.
Figure 13:
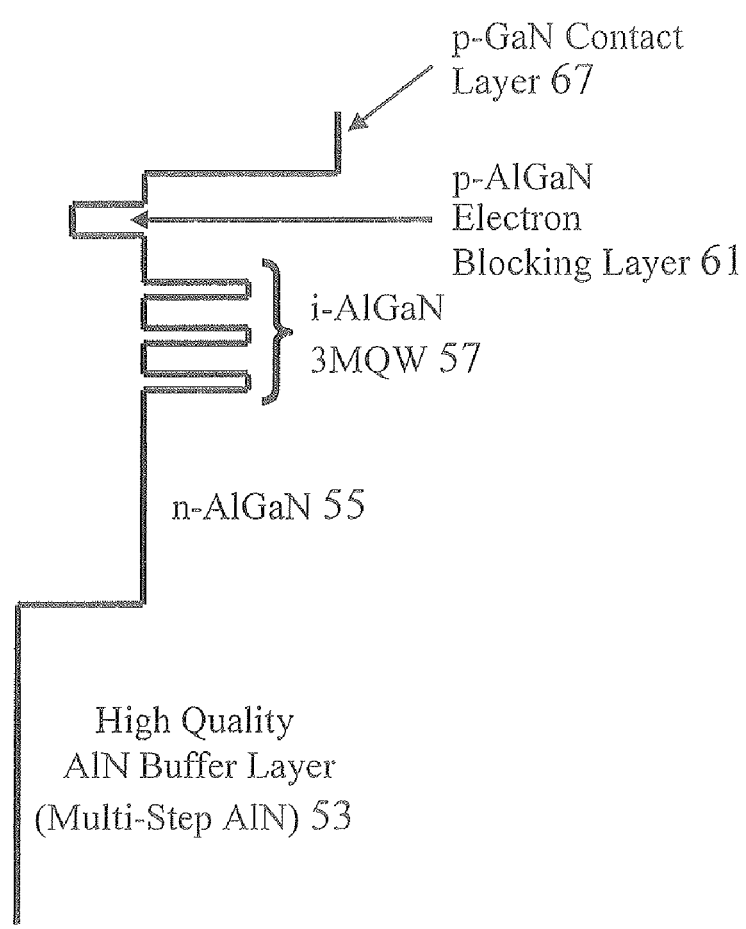
FIG. 13 schematically shows an energy band structure of the structure shown in FIG. 12 before a voltage is applied.
Figure 14:
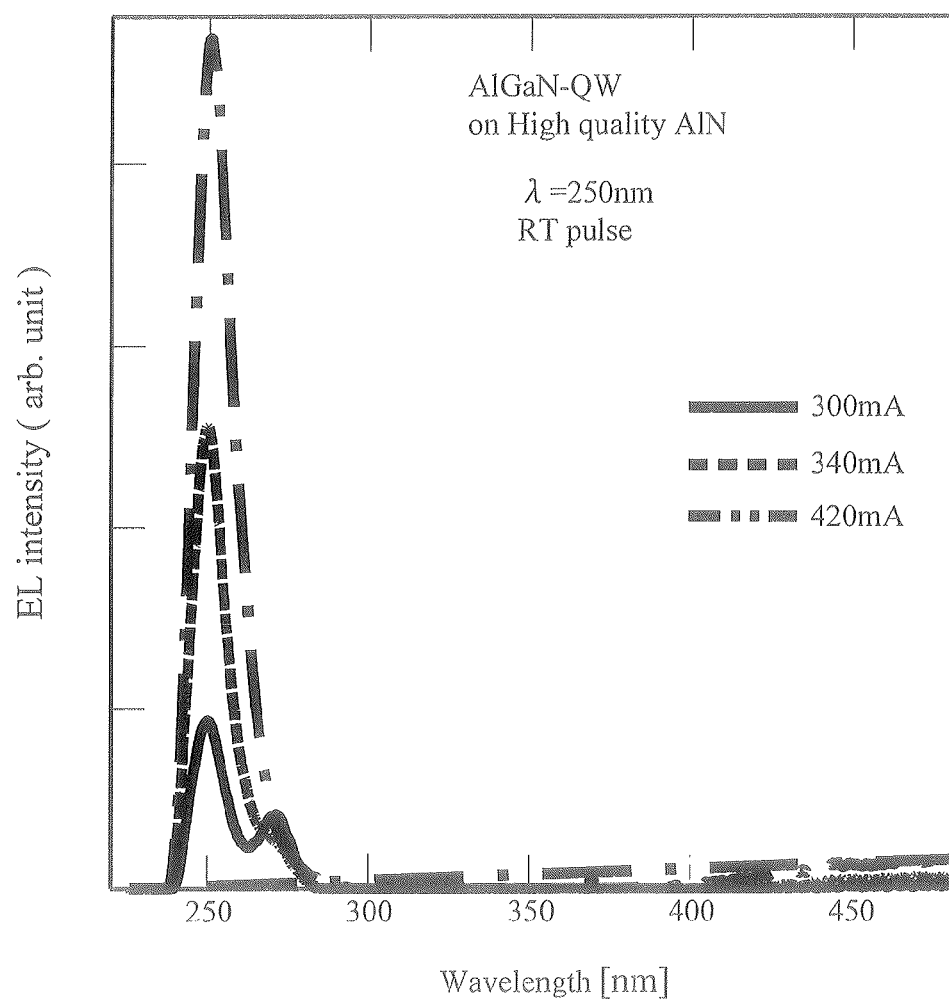
FIG. 14 shows results of EL measurement of the LED.
Figure 15:
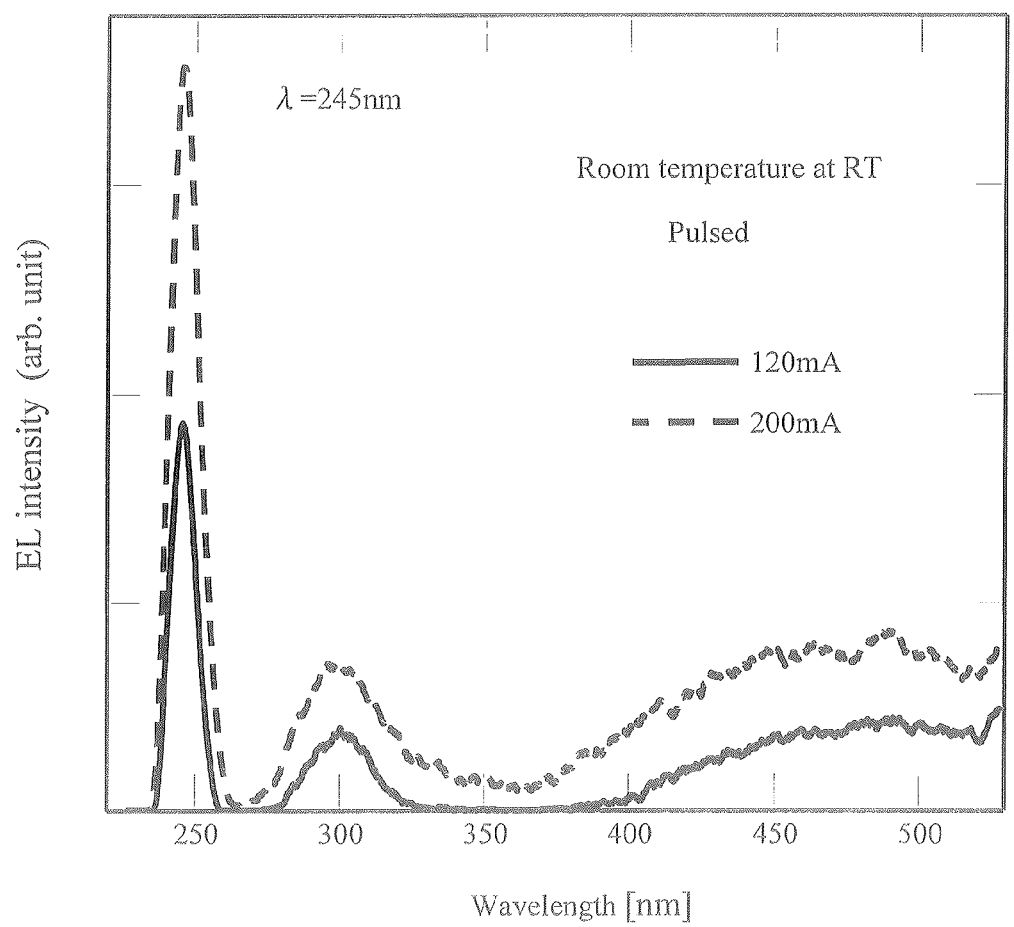
FIG. 15 shows results of observation of EL light emission at 245 nm.

A technique for manufacturing a 250-nm deep ultraviolet LED will be described below. FIG. 12 shows an exemplary configuration of a 250-nm deep ultraviolet LED of the present embodiment. The deep ultraviolet LED device shown in FIG. 12 includes an AlN buffer layer 53 formed on a sapphire substrate 51 by the multi-step growth method and an LED structure formed on the AlN buffer layer 53. The LED structure includes an $Al_{0.75}Ga_{0.25}N/Al_{0.60}Ga_{0.40}N$-layer MQW 57, an electron blocking layer 61 of Mg-doped $Al_{0.95}Ga_{0.05}N$, a Mg-doped $Al_{0.75}Ga_{0.25}N$ layer 63, and a Mg-doped p-type GaN layer 65, in this order starting from the AlN buffer layer 53 side. A first electrode 67 made of Ni/Al is formed on the Mg-doped p-type GaN layer 65 and a second electrode 71 made of Ni/Al is formed on the $Al_{0.75}Ga_{0.25}N/Al_{0.60}Ga_{0.40}N$ 3-layer MQW 57. UV output (shown at the bottom) can be obtained from the sapphire substrate 51 side by applying a voltage between the first electrode 67 and the second electrode 71. FIG. 13 schematically shows an energy band structure of the structure described above before the voltage is applied. FIG. 14 shows the result of EL measurement on the LED described above. As shown in FIG. 14, a good single peak has been observed with the structure at room temperature at a wavelength of 250 nm. EL light emission at a wavelength of 245 nm has also been observed as shown in FIG. 15. Thus, a good semiconductor light emitting device has been formed.

Figure 16:
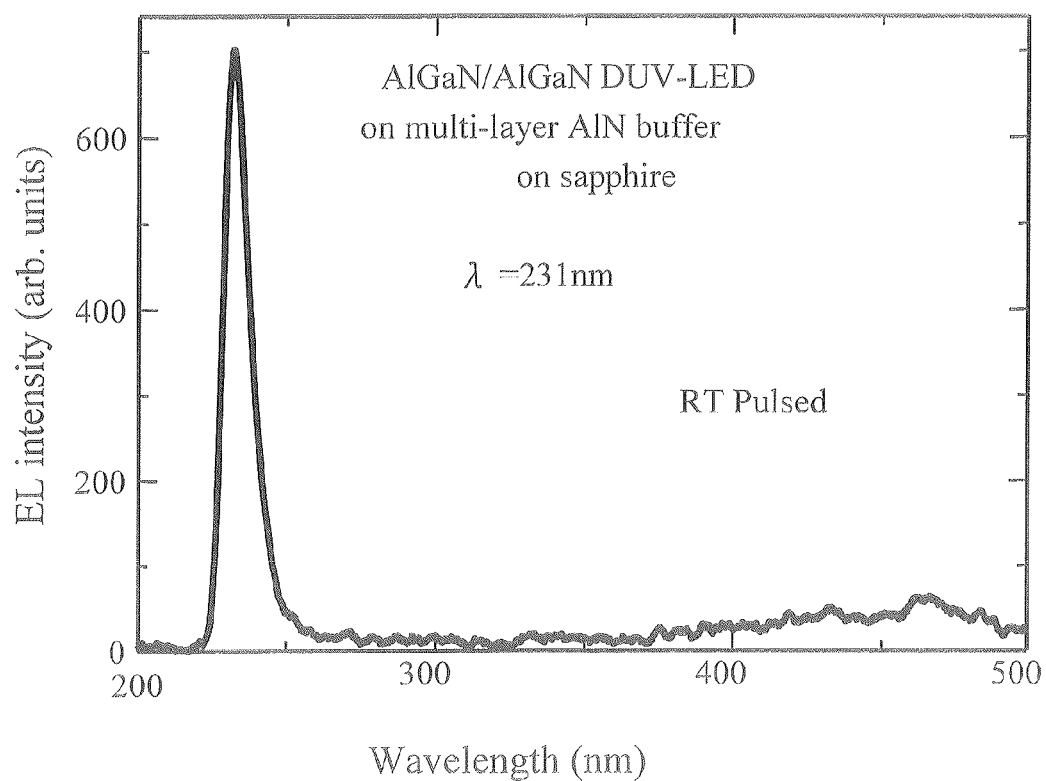
FIG. 16 shows the latest LED single-peaked light emission data at 231 nm.

FIG. 16 shows the latest LED single-peaked light emission data at 231 nm. The device structure is the same as that shown in FIG. 15 but the composition of Al is increased. It can be seen that band engineering that can adjust a light emission wavelength by changing the composition can be implemented. Furthermore, the significance that the single peak has been obtained at 231 nm is great. Thus, it can be seen that a deep ultraviolet light emitting device that emits light in the 250-nm band (or shorter wavelength regions) can be implemented by using the crystal growth technique according to the present embodiment.

Figure 17:
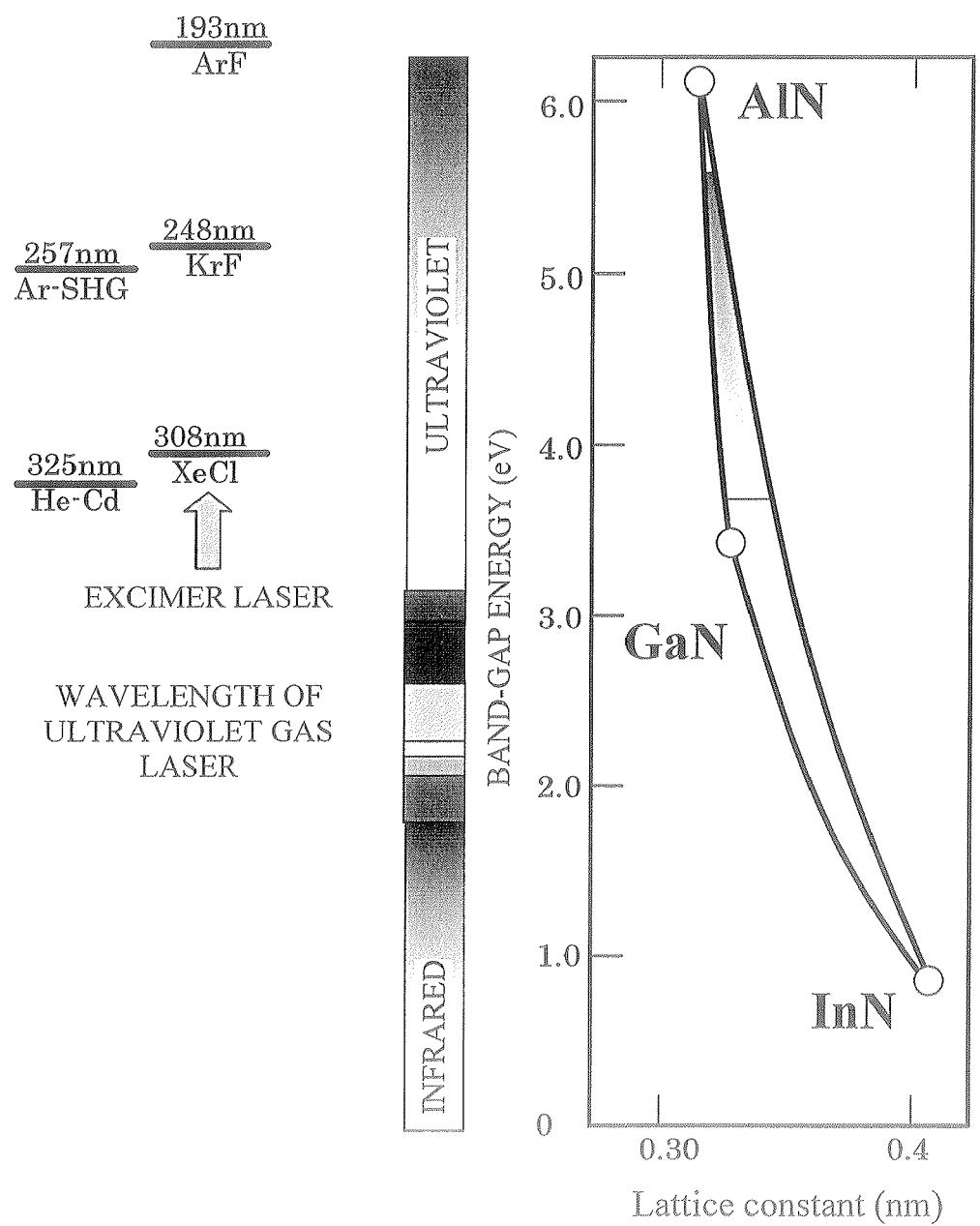
FIG. 17 shows the relationship between the lattice constant and band-gap energy of an InAlGaAs-based quaternary mixed crystal.

While an example has been shown in which the high-quality buffer layer of the embodiment is used in fabrication of a light emitting device using an AlGaN compound semiconductor, the high-quality buffer layer according to the present embodiment is also applicable to compounds having various compositions as shown in FIG. 17. The device formed on the high-quality buffer layer may be a non-optical electronic device.

While a sapphire substrate is used as the substrate of a semiconductor light emitting device in the embodiment described above, the substrate is not limited to a sapphire substrate. Any substrate on which a single-crystal AlN layer used as a buffer layer can be grown may be used. For example, a substrate such as a spinel substrate, a silicon (Si) substrate, a silicon carbide (SiC) substrate, a zinc oxide substrate, a gallium phosphide (GaP) substrate, a gallium arsenide (GaAs) substrate, a magnesium oxide substrate, a manganese oxide substrate, a zirconium boride substrate, or group III nitride semiconductor crystal substrate may be used.

The present invention can be used as a deep ultraviolet light emitting device.

What is claimed is:

1. A semiconductor structure producing method comprising the steps of:
   preparing a substrate; and
   forming a group III-V crystal layer on the substrate, the step of forming the group III-V crystal layer comprising the step of
      forming a nucleation layer on the substrate, the step of
      forming a group V source pulsed supplied layer on the nucleation layer by pulsed supply that supplies a group V source in a time-pulsed manner while supplying a group III source, and the step of
      forming a continuous supplied layer on the group V source pulsed supplied layer by simultaneously and continuously supplying a group III source and a group V source, wherein the step of forming the group III-V crystal layer forms a buffer layer capable of emitting light in an ultraviolet wavelength region and suitable for a light emitting device structure.

2. A semiconductor structure producing method comprising the steps of:
   preparing a sapphire substrate; and
   forming a group III nitride layer on the substrate, the step of forming the group III nitride layer comprising
      the step of forming a nucleation layer on the sapphire substrate,
      the step of forming a nitrogen source pulsed supplied layer on the nucleation layer by pulsed supply that supplies a nitrogen source in a time-pulsed manner while supplying a group III source, and the step of forming a continuous supplied layer on the nitrogen source pulsed supplied layer by simultaneously and continuously supplying a group III source and a nitrogen source, wherein the step of forming the nucleation layer is a step of repeating a cycle of continuously supplying a group III source while intermittently supplying a nitrogen source by providing an Al-rich condition with a low V-III ratio such that the polarity of the surface can be made group-III polarity.

3. A semiconductor structure producing method comprising the steps of:

preparing a sapphire substrate; and forming an AlN layer on the sapphire substrate, the step of forming the AlN layer comprising the step of forming a nucleation layer on the sapphire substrate, the step of forming a nitrogen source pulsed supplied layer on the nucleation layer by pulsed supply that supplies a nitrogen source in a time-pulsed manner while supplying an aluminum source, the step of forming a continuous supplied layer on the nitrogen source pulsed supplied layer by simultaneously and continuously supplying an aluminum source and a nitrogen source, and the step of forming a buffer layer, wherein the step of forming a nucleation layer is a step of repeating a cycle of continuously supplying an aluminum source while intermittently supplying a nitrogen source by providing an Al-rich condition with a low V-III ratio such that the polarity of the surface can be made group-III polarity.

4. The semiconductor structure producing method according to claim 1, wherein the step of forming the nucleation layer is formed by pulsed supply.

5. The method according to claim 3, wherein the step of forming the layer by pulsed supply comprises the step of intermittently supplying a nitrogen source.

6. The semiconductor structure producing method according to claim 5, wherein an Al source is continuously supplied.

7. The semiconductor structure producing method according to claim 5, comprising the step of providing a plurality of sets of the pulsed supplied layer and the continuous supplied layer.

8. A semiconductor structure producing method comprising the steps of:

preparing a substrate; and forming a group III-V crystal layer on the substrate, the step of forming the III-V crystal layer comprising the step of forming a group V source pulsed supplied layer on the group III-V crystal layer by pulsed supply that supplies group V source in a time-pulsed manner while supplying a group III source; the step of forming a continuous supplied layer on the group V source pulsed supplied layer by simultaneously and continuously supplying a group III source and a group V source, wherein the step of forming the group III-V crystal layer forms a buffer layer capable of emitting light in an ultraviolet wavelength region and suitable for a light emitting device structure.

9. The method of claim 1, wherein the step of forming a nitrogen source pulsed supplied layer is a step of forming the pulsed supplied layer by using nitrogen source pulsed supply in a second mode that increases grain size under conditions with a V-III ratio higher than that for the step of forming a nucleation layer.

10. The method of claim 9, wherein the step of forming a continuous supplied layer is carried out under conditions with a V-III ratio higher than that for the step of forming a nucleation layer.

11. The method of claim 1, wherein the step of forming a continuous supplied layer is carried out under conditions with a V-III ratio higher than that for the step of forming a nucleation layer.

12. The method of claim 3, wherein the step of forming a nitrogen source pulsed supplied layer is a step of forming the pulsed supplied layer by using a nitrogen source pulsed supply in a second mode that increases grain size under conditions with a V-III ratio higher than that for the step of forming a nucleation layer.

13. The method of claim 12, wherein the step of forming a continuous supplied layer is carried out under conditions with a nitrogen-aluminum ratio higher than that for the step of forming a nucleation layer.

14. The method of claim 3, wherein the step of forming a continuous supplied layer is carried out under conditions with a nitrogen-aluminum ratio higher than that for the step of forming a nucleation layer.

* * * * *